(12) United States Patent
Zhou

(10) Patent No.: US 8,883,626 B2
(45) Date of Patent: Nov. 11, 2014

(54) INTERCONNECTION STRUCTURES AND FABRICATION METHOD THEREOF

(71) Applicant: Semiconductor Manufacturing International (Shanghai) Corporation, Shanghai (CN)

(72) Inventor: Ming Zhou, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/060,975

(22) Filed: Oct. 23, 2013

(65) Prior Publication Data

US 2014/0191412 A1    Jul. 10, 2014

(30) Foreign Application Priority Data

Jan. 10, 2013   (CN) .......................... 2013 1 0009776

(51) Int. Cl.
*H01L 21/44* (2006.01)
*H01L 23/48* (2006.01)
*H01L 21/768* (2006.01)

(52) U.S. Cl.
CPC ........ *H01L 21/76877* (2013.01); *H01L 23/481* (2013.01)
USPC ........... 438/612; 438/617; 438/687; 438/689; 257/E21.575

(58) Field of Classification Search
USPC ........... 438/612–617, 687, 689; 257/E21.575
See application file for complete search history.

(56) References Cited

U.S. PATENT DOCUMENTS 7,514,797 B2    4/2009   Chen et al.
2008/0296763 A1 * 12/2008   Chen et al. .................... 257/738

* cited by examiner

*Primary Examiner* — Thanhha Pham
(74) *Attorney, Agent, or Firm* — Anova Law Group, PLLC

(57) ABSTRACT

A method is provided for fabricating an interconnection structure. The method includes providing a semiconductor substrate having certain semiconductor devices inside, a dielectric layer covering the semiconductor devices, and vias inside the dielectric layer connecting with connection pads of the semiconductor devices. The method also includes forming a first conductive layer on the semiconductor substrate, and forming a second conductive layer with smaller grain sizes by doping the first conductive layer. Further, the method includes forming an interconnection pad by patterning the second conductive layer, and forming a connection wire on the interconnection pad.

14 Claims, 5 Drawing Sheets

US 8,883,626 B2

INTERCONNECTION STRUCTURES AND FABRICATION METHOD THEREOF

CROSS-REFERENCES TO RELATED APPLICATIONS

This application claims the priority of Chinese patent application No. 201310009776.5, filed on Jan. 10, 2013, the entirety of which is incorporated herein by reference.

FIELD OF THE INVENTION

The present invention generally relates to the field of semiconductor manufacturing technology and, more particularly, relates to interconnection structures and fabrication techniques thereof.

BACKGROUND

With rapid development on integrated circuit (IC) technology, electronic devices have been following into trends of miniaturization, intelligence, high performance, and high reliability. IC packaging may not only directly affect the performance of ICs, electronic modules and systems, but also limit the miniaturization, low cost and reliability of an entire electronic system. With the continuous downsizing of electronic chips in the ICs, and the continuous increase of the integration degree, requirements of the IC packaging technology have been continually increased in electronic industries.

FIG. 1 illustrates an existing packaging structure. The packaging structure includes: a circuit 112; a connection via 118 under the circuit 112 connecting with the circuit 112; a bottom wiring layer 116 connecting with the connection via 118; a through silicon via 114 connecting with the bottom wiring layer 116; a top wiring layer 810 connecting with the through silicon via 114; and a solder ball 1010 connecting with the top wiring layer 810. Connection ports of the circuit 112 may be lead out by interconnection structures through the connection via 118, the bottom wiring layer 116, the through silicon via 114, the top wiring layer 810 and the solder ball 1010.

In existing techniques, the interconnection structures of the bottom wiring layer 116 and the top wiring layer 810 are often made of a thin layer of metal. Mechanical strength of the thin layer of metal may be relatively low, and the metal layer may be easily broken. Thus, a yield of the interconnection may be affected, and the reliability of a packaging structure may be affected as well. The disclosed methods and systems are directed to solve one or more problems set forth above and other problems.

BRIEF SUMMARY OF THE DISCLOSURE

One aspect of the present disclosure includes a method for fabricating an interconnection structure. The method includes providing a semiconductor substrate have certain semiconductor devices inside, a dielectric layer covering the semiconductor devices, and vias inside the dielectric layer connecting with connection pads of the semiconductor devices. The method also includes forming a first conductive layer on the semiconductor substrate, and forming a second conductive layer with smaller grain sizes by doping the first conductive layer. Further, the method includes forming an interconnection pad by patterning the second conductive layer, and forming a connection wire on the interconnection pad.

Another aspect of the present disclosure includes an interconnection structure. The interconnection structure includes a semiconductor substrate having certain semiconductor devices inside, a dielectric layer covering the semiconductor devices, and vias in the dielectric layer connecting with connection pads of the semiconductor devices. The interconnection structure also includes an interconnection pad doped with certain types of ions to have smaller grain sizes. Further, the interconnection structure includes a connection wire bonded on the interconnection pad.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

A plurality of types of interconnection structures may exist in an IC chip, such as a wire bonding structure consisting of a metal thin film, and/or a solder pad/solder ball structure consisting a metal thin film and a solder ball, etc. The mechanical strength of the thin film parts of these interconnection structures may impact quality of these interconnection structures. For example, after a wire bonding process, an aluminum thin film of the wire bonding structure may become significantly less because the aluminum film may be too soft to resist striking force from the wire bonding process. The aluminum thin film may be poly crystalline, decreasing the grain sizes of the aluminum thin may improve its mechanical strength, and the quality of the wire bonding structure.

Figure 7:
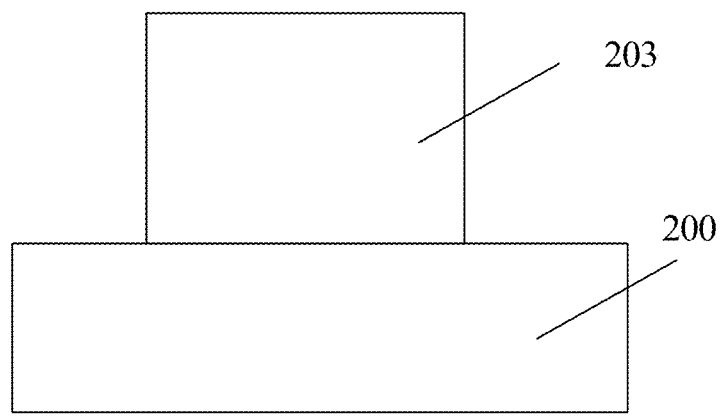
FIGS. 7-8 illustrate semiconductor structures corresponding to certain stages of an exemplary fabrication process for an interconnection structure.
Figure 8:
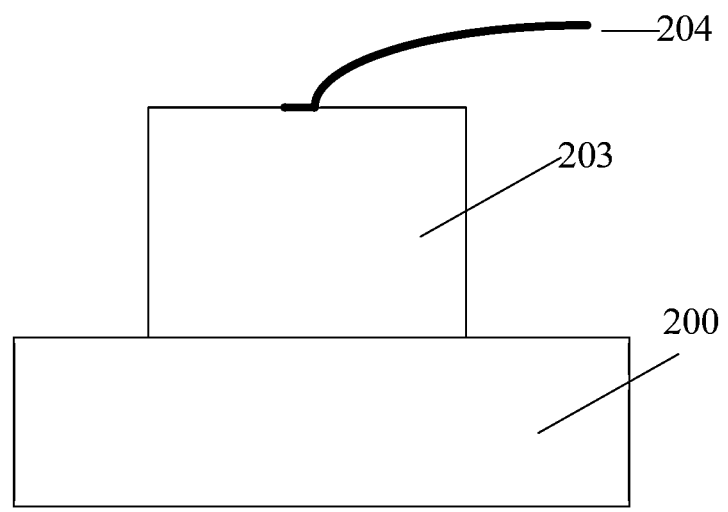
Figure 9:
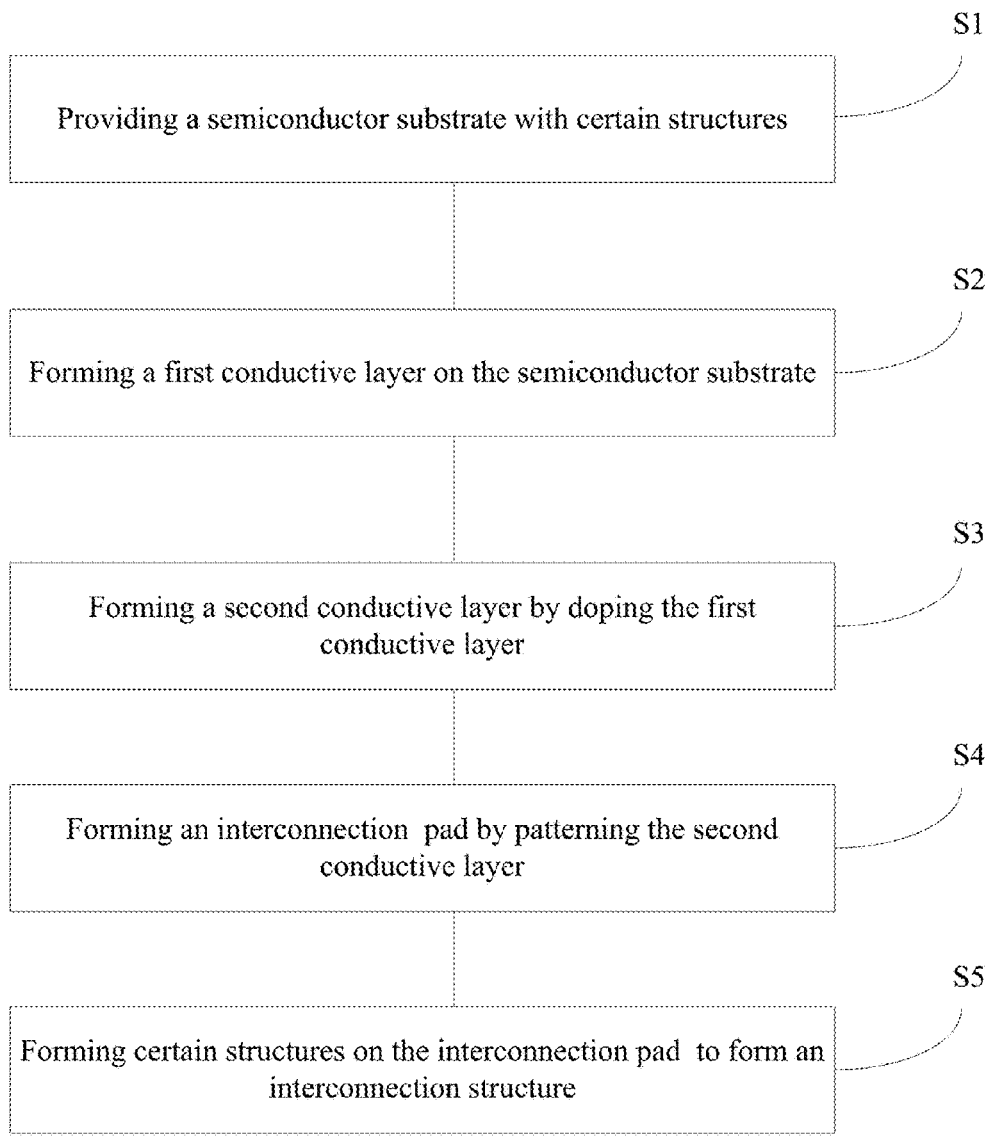
FIG. 9 illustrates an exemplary fabrication process for an interconnection structure consistent with the disclosed embodiments.

FIG. 9 illustrates an exemplary fabrication process for an interconnection structure consistent with the disclosed embodiments; and FIGS. 2-8 illustrate semiconductor structures corresponding to certain stages of the exemplary fabrication process.

Figure 1:
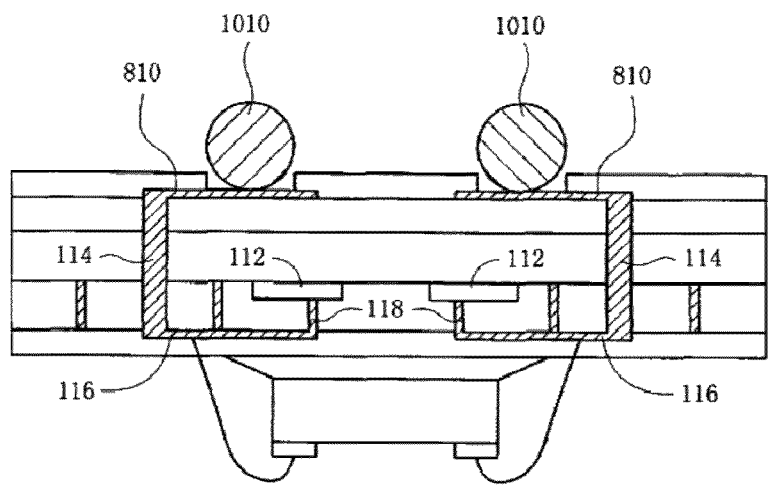
FIG. 1 illustrates an existing packaging structure.
Figure 2:
FIGS. 2-4 illustrate semiconductor structures corresponding to certain stages of an exemplary fabrication process for an interconnection structure.

As shown in FIG. 9, at the beginning of the fabrication process, a semiconductor substrate with certain structures is provided (S1). FIG. 2 illustrates a corresponding semiconductor structure.

As shown in FIG. 2, a semiconductor substrate 200 is provided. Certain semiconductor devices (not shown) may be formed inside and/or on top of the semiconductor substrate 200. The semiconductor device may be one or more of MOS transistor, diode, memory, capacitor, resistor, inductor and MEMS, etc. The semiconductor substrate 200 may also have an isolation layer (not shown) covering the semiconductor device. Connection vias (not shown) may be formed in the isolation layer to connect connection pads (not shown) of the semiconductor device with other devices and/or circuits. Certain semiconductor structure(s) may be omitted, and certain other semiconductor structure (s) may be included.

The semiconductor substrate 200 may include any appropriate type of semiconductor material, such as single crystal silicon, poly silicon, amorphous silicon, silicon germanium, carborundum, indium antimonide, lead telluride, indium arsenide, indium phosphide, gallium arsenide, gallium antimonide, alloy semiconductor, epitaxially grown materials and/or silicon on insulator (SOI), etc. The isolation layer may be made of silicon oxide, silicon nitride, or silicon oxynitride, etc. The connection via may be made of any appropriate type of conductive material, such as copper, or gold, etc.

Figure 3:
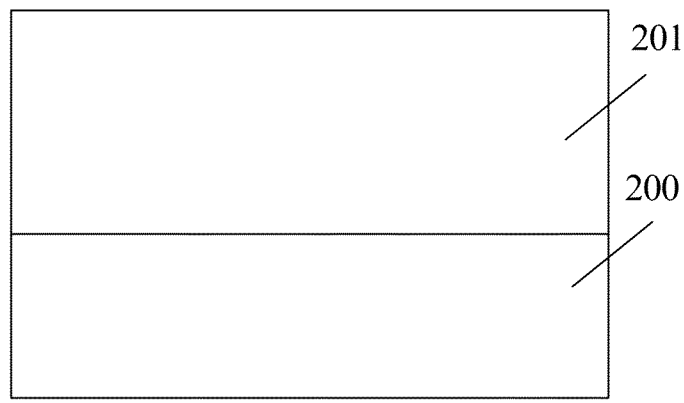

Returning to FIG. 9, after providing the semiconductor substrate 200 with certain structures, a first conductive layer may be formed (S2). FIG. 3 illustrates a corresponding semiconductor structure.

As shown in FIG. 3, a first conductive layer 201 is formed on the semiconductor substrate 200. The first conductive layer 201 may be made of any appropriate material, such as metal material including W, Al, Cu, Ti, Ta, TaN, NiSi, CoSi, TiN, TiAl or TaSiN, or transparent conductive material including ITO, IZO, or FTO, etc. In one embodiment, the first conductive layer 201 is Al. In certain other embodiments, the first conductive layer 201 is Cu.

The first conductive layer 201 may be formed by any appropriate process, such as a chemical vapor deposition (CVD) process, a physical vapor deposition (PVD) process, or an electro deposition process, etc. In one embodiment, the first conductive layer 201 is formed by a PVD process, such as a thermal evaporation process, or a sputter process, etc.

Figure 4:
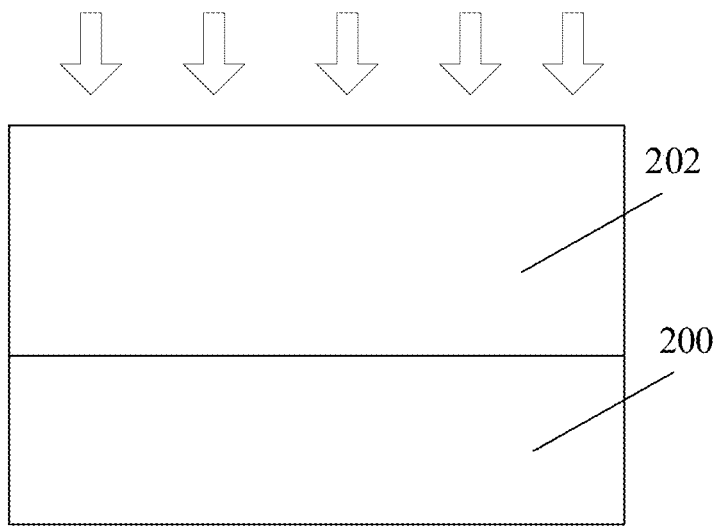

Returning to FIG. 9, after forming the first conductive layer 201, the first conductive layer 201 may be doped by certain types of ions to form a second conductive layer (S3). FIG. 4 illustrates a corresponding semiconductor structure.

As shown in FIG. 4, a second conductive layer 202 is formed by doping the first conductive layer 201 with certain types of ions. Ions used to dope the first conductive layer 201 may cause grain sizes of the first conductive layer 201 to be decreased, and to form the second conductive layer 202 with smaller grain sizes. The smaller grains of the second conductive layer 202 may be densely packed with a small grain size distribution, and gaps between the grains may be reduced. A smaller gap between grains may increase an ability to withstand external forces, thus the mechanical strength of a subsequently formed interconnection structure may be enhanced.

Figure 5:
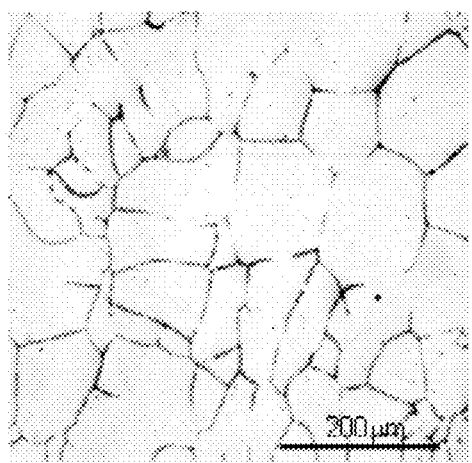
FIGS. 5-6 illustrate scanning electron microscopy images of an interconnection structure before and after an ion implantation process consistent with the disclosed embodiments.
Figure 6:
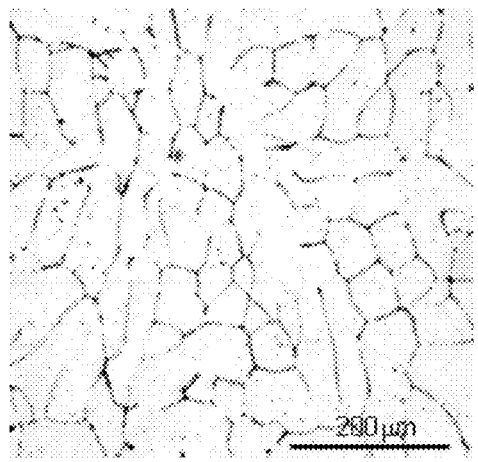

FIG. 5 and FIG. 6 illustrate scanning electron microscopy (SEM) images of the first conductive layer 201 and the second conductive layer 202, respectively. As shown in FIG. 5, grain sizes of the first conductive layer 201 may be in a range of approximately 100 μm-200 μm. The grain sizes of the first conductive layer 201 may have an uneven distribution, i.e., the grain sizes are different in a wide range.

As shown in FIG. 6, grain sizes of the second conductive layer 202 formed by doping the first conductive layer 201 may be in a range of approximately 50 μm-80 μm. Thus, the grain sizes of the second conductive layer 201 may be smaller than the grain sizes of the first conductive layer 202. The grain sizes of the second conductive layer 202 may have an even distribution, i.e., the grain sizes are similar in a small range.

A difference between the grain sizes of the second conductive layer 202 and the first conductive layer 201 may impact certain aspects of the interconnection structure and fabrication techniques thereof If the difference between the grain sizes of the second conductive layer 202 and the first conductive layer 201 is significantly big, requirements for a doping process to form the second conductive layer 202 may be relatively high, thus doping time may be increased. A production cost may also be increased. If the difference between the grain sizes of the second conductive layer 202 and the first conductive layer 201 is substantially small, an effect for enhancing the mechanical strength may be unobvious. In certain embodiments, the difference between the grain sizes of the second conductive layer 202 and the first conductive layer 201 may be in a ratio of approximately 0.1~0.9.

The first conductive layer 201 may be doped by any appropriate process to form the second conductive layer 202, such as a thermal diffusion process, or an ion implantation process, etc. The ion for doping the first conductive layer 201 to form the second conductive layer 202 may by boron ion, phosphor ion, arsenic ion, or other appropriate ions.

In one embodiment, an ion implantation process is used to doping the first conductive layer 201. Boron ions are used to dope the first conductive layer 201 made of Al to form the second conductive layer 202. The ion implantation process may have a relatively high efficiency, thus process cycles may be shortened.

Ion implantation energy and dosage may impact certain aspects of the interconnection structure. If the ion implantation energy is significantly high, it may be easy to damage the first conductive layer 201. If the ion implantation energy is substantially low, it may be difficult for the boron ions to reach a relatively deep position of the first conductive layer 201. If the depth is not sufficient, boron ions may be unable to be uniformly distributed in the finally formed second conductive layer 202. If the ion implantation dosage is significantly high, it may affect electrical properties of the interconnection structure. In certain embodiments, the boron ion implantation energy may be in a range of approximately 5 KeV~50 KeV, and the dosage may be smaller than 1E27 atoms/$cm^2$.

An ion bombardment in the ion implantation process may induce large numbers of atomic displacements, and create larger number of preferential sites for nucleation. Thus smaller size grains may be formed.

Further, in certain embodiments, a thermal annealing process may be performed after the boron implantation process. Various protection gases may be used in the thermal annealing process, such as helium, nitrogen, or argon, etc. The thermal annealing process may cause the boron ion to diffuse, and cause the finally formed second conductive layer 202 to have a better boron ion distribution. Thus, an uniform grain size distribution of the second conductive layer 202 may be obtained. The uniform grain size distribution may cause the second conductive layer 202 to endure a more even external force, thus the mechanical strength of the second conductive layer 202 may be enhanced.

Certain parameters of the thermal annealing process may impact certain aspects the interconnection structure. If a thermal annealing temperature is significantly high and the thermal annealing time is significantly long, it may increase the production cost. If the thermal annealing temperature is substantially low and the thermal annealing time is substantially short, the boron ions in the second conductive layer 202 may be unable to have a desired distribution. In certain embodiments, a gas flow of the protection gas may be in a range of approximately 100 sccm~5000 sccm; the annealing temperature may be in a range of approximately of 250° C.~450° C.; and the annealing time may be in a range of approximately 15 s~300 s.

In certain other embodiments, the second conductive layer 202 may be formed by in situ ion doping the first conductive layer 201. An ion doping process using the in situ ion doping may be compatible with existing instruments. Further, the interconnection structures may be unnecessary to be taken out from a vacuum chamber and moved to another vacuum chamber, thus it may reduce process steps, and simplify the process. Further, the in situ ion doping process may limit a crystal growth of the first conductive layer 201, thus it may reduce the grain sizes of the finally formed second conductive layer 202.

Returning to FIG. 9, after forming the second conductive layer 202, an interconnection pad for may be formed (S4). FIG. 7 illustrates a corresponding semiconductor structure.

As shown in FIG. 7, an interconnection pad 203 is formed by patterning the second conductive layer 202. The interconnection pad 203 may connect with the via in the semiconductor substrate 200, and lead out the connection pad of the semiconductor device in the semiconductor substrate 200.

The interconnection pad 203 may be formed by any appropriate process, such as a dry etching process, or a wet etching process, etc. In certain other embodiments, the interconnection pad 203 may be patterned when the first conductive layer 201 is formed, i.e. the first conductive layer 201 is deposited with a shape of the interconnection pad 203.

Returning to FIG. 9, after forming the interconnection pad 203, certain structures may be formed on the interconnection pad 203 to form an interconnection structure (S4). FIG. 8 illustrates a corresponding semiconductor structure.

As shown in FIG. 8, a connection wire 204 is formed bonded to the interconnection pad 203. A wire bonding structure consisting of the interconnection pad 203 and the connection wire 204 is formed. The connection wire 204 may be made of any appropriate material, such as aluminum, or gold, etc. A process for bonding the connection wire 204 to the interconnection pad 203 may refer as a wire bonding process.

The interconnection pad 203 may have an enhanced mechanical strength because it is formed by patterning the second conductive layer, a mechanical strength of the wire bonding structure consisting of the interconnection pad 203 and the interconnection pad 203 may be improved. The wire bonding structure may be used to connect the semiconductor device in the semiconductor substrate 200 to a packaging socket, etc, thus reliability of a packaging structure may be improved too.

In certain other embodiments, a solder ball may be formed on the interconnection pad 203 to form a solder pad/solder ball structure. A mechanical strength of a sold pad/solder structure may be improved after melting the solder ball to bond other structures. The solder pad/solder ball structure may be used to connect the semiconductor device to other devices and/or pins of a packing socket, a reliability of a packaging structure may improved.

In certain other embodiments, the above described process for forming the interconnection pad 203 may also be used to form one or more of solder line, electrode, and via. A mechanical strength of an interconnection structure consisting of one or more one or more of solder line, electrode, and via and other type of structures may be improved.

Thus, an interconnection structure may be formed by the above disclosed processes and methods, and a corresponding interconnection structure is illustrated in FIG. 8. The interconnection structure includes a semiconductor substrate 200 having certain semiconductor devices inside, a dielectric layer covering the semiconductor devices, and vias in the dielectric layer connecting with connection pads of the semiconductor devices. The interconnection structure also includes an interconnection pad 203 doped with certain types of ions to have smaller grain sizes. Further, the interconnection structure includes a connection wire 204. The detailed structures and intermediate structures are described above with respect to the fabrication processes.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating an interconnection structure, comprising:
   providing a semiconductor substrate have certain semiconductor devices inside, a dielectric layer covering the semiconductor devices, and vias inside the dielectric layer connecting with connection pads of the semiconductor devices;
   forming a first conductive layer on the semiconductor substrate
   forming a second conductive layer by doping the first conductive layer to have smaller grain sizes;
   forming an interconnection pad by patterning the second conductive layer; and
   forming certain structure on the interconnection pad.

2. The method according to claim 1, wherein forming certain structure on the interconnection pad further includes:
   bonding a connection wire on the interconnection pad to form a wire bonding structure.

3. The method according to claim 1, wherein forming certain structure on the interconnection pad further includes:
   forming a solder ball on the interconnection pad to form a solder ball/solder pad interconnection structure.

4. The method according to claim 1, wherein:
   the first conductive layer is formed by a physical vapor deposition process.

5. The method according to claim 1, after forming the second conductive layer, further including:
   annealing the second conductive layer.

6. The method according to claim 1, wherein:
   the first conductive layer and the second conductive layer are made of aluminum.

7. The method according to claim 1, wherein:
   doping ions of the first conductive layer is boron ions.

8. The method according to claim 1, wherein:
   process for doping the first conductive layer is an ion implantation process.

9. The method according to claim 1, wherein:
   the first conductive layer is made of copper.

10. The method according to claim 1, wherein:
    grain sizes of the second conductive layer is approximately 0.1~0.9 of grain sizes of the first conductive layer.

11. The method according to claim 1, wherein forming the second conductive layer further includes:
    doping the first connective layer in situ to form the second conductive layer.

12. The method according to claim 4, wherein:
    protection gas for annealing the second conductive layer is helium or nitrogen.

13. The method according to claim 7, wherein:
    an energy of the ion implantation process is in a range of approximately 5 KeV~50 KeV, and dose is less than approximately 1E27 atoms/cm$^2$.

14. The method according to claim 12, wherein:
a gas flow of helium or nitrogen is in a range of approximately 100 sccm~5000 sccm;
an annealing temperature is in a range of approximately 250° C.~450° C.; and
an annealing time is in a range of approximately 15 s~300 s.

* * * * *